(12) United States Patent
Brud et al.

(10) Patent No.: US 8,253,253 B2
(45) Date of Patent: *Aug. 28, 2012

(54) CONNECTING AND BONDING ADJACENT LAYERS WITH NANOSTRUCTURES

(75) Inventors: Andrzej Brud, Henån (SE); Mohammad Shafiqul Kabir, Gothenburg (SE)

(73) Assignee: Smoltek AB, Göteborg (SE)

(*) Notice: Subject to any disclaimer, the term of this patent is extended or adjusted under 35 U.S.C. 154(b) by 0 days.

This patent is subject to a terminal disclaimer.

(21) Appl. No.: 13/361,436

(22) Filed: Jan. 30, 2012

(65) Prior Publication Data

US 2012/0125537 A1    May 24, 2012

Related U.S. Application Data

(63) Continuation of application No. 12/210,091, filed on Sep. 12, 2008, now Pat. No. 8,106,517.

(60) Provisional application No. 60/971,859, filed on Sep. 12, 2007, provisional application No. 60/974,045, filed on Sep. 20, 2007.

(51) Int. Cl.
    *H01L 29/40*    (2006.01)
    *H01L 21/44*    (2006.01)

(52) U.S. Cl. .................................. 257/773; 438/666

(58) Field of Classification Search .................. 438/620, 438/666, 675, 775; 257/773–775, E23.074, 257/E23.165

See application file for complete search history.

(56) References Cited

U.S. PATENT DOCUMENTS

| 6,297,592 | B1 | 10/2001 | Goren et al. |
| 6,720,728 | B2 | 4/2004 | Den et al. |
| 6,724,017 | B2 | 4/2004 | Semeria et al. |
| 6,737,939 | B2 | 5/2004 | Hoppe et al. |
| 6,739,932 | B2 | 5/2004 | Yaniv et al. |
| 6,858,197 | B1 | 2/2005 | Delzeit |
| 6,962,823 | B2 | 11/2005 | Empedocles et al. |
| 6,965,513 | B2 | 11/2005 | Montgomery et al. |
| 7,084,507 | B2 | 8/2006 | Awano |
| 7,094,692 | B2 | 8/2006 | Horibe et al. |
| 7,682,973 | B2 | 3/2010 | Kim et al. |
| 7,687,876 | B2 | 3/2010 | Kabir |
| 7,777,291 | B2 | 8/2010 | Kabir |
| 7,977,761 | B2 | 7/2011 | Kabir |
| 8,106,517 | B2 * | 1/2012 | Kabir et al. ................... 257/773 |
| 2002/0185949 | A1 | 12/2002 | Yaniv et al. |
| 2003/0117770 | A1 | 6/2003 | Montgomery et al. |
| 2003/0197456 | A1 | 10/2003 | Den et al. |
| 2003/0236000 | A1 | 12/2003 | Vogeli et al. |

(Continued)

FOREIGN PATENT DOCUMENTS

JP    2000086216 A    3/2000

(Continued)

OTHER PUBLICATIONS

Seidel, R. et al., "High-Current Nanotube Transistors", Nano Letters, vol. 4, No. 5 (Mar. 25, 2004), pp. 831-834.

(Continued)

*Primary Examiner* — Calvin Lee
(74) *Attorney, Agent, or Firm* — Fish & Richardson P.C.

(57) ABSTRACT

An apparatus, comprising two conductive surfaces or layers and a nanostructure assembly bonded to the two conductive surfaces or layers to create electrical or thermal connections between the two conductive surfaces or layers, and a method of making same.

6 Claims, 10 Drawing Sheets

U.S. PATENT DOCUMENTS

| | | |
|---|---|---|
| 2004/0005723 A1 | 1/2004 | Empedocles et al. |
| 2004/0037972 A1 | 2/2004 | Simon et al. |
| 2004/0101468 A1 | 5/2004 | Liu et al. |
| 2004/0161929 A1 | 8/2004 | Son et al. |
| 2004/0182600 A1 | 9/2004 | Kawabata et al. |
| 2004/0195957 A1 | 10/2004 | Hu et al. |
| 2004/0251841 A1 | 12/2004 | Negishi et al. |
| 2005/0046322 A1 | 3/2005 | Kim et al. |
| 2005/0127351 A1 | 6/2005 | Tolt |
| 2005/0212398 A1 | 9/2005 | Okano et al. |
| 2005/0229837 A1 | 10/2005 | Marty et al. |
| 2006/0091557 A1 | 5/2006 | Sakamoto et al. |
| 2006/0238096 A1 | 10/2006 | Han et al. |
| 2007/0096304 A1 | 5/2007 | Kabir |
| 2007/0243124 A1 | 10/2007 | Baughman et al. |
| 2008/0003733 A1 | 1/2008 | Kim et al. |
| 2008/0090052 A1 | 4/2008 | Hori et al. |
| 2008/0107892 A1 | 5/2008 | Jiao et al. |
| 2008/0224115 A1 | 9/2008 | Bakkers et al. |
| 2008/0232755 A1 | 9/2008 | Kabir |
| 2009/0072408 A1 | 3/2009 | Kabir et al. |
| 2009/0233124 A1 | 9/2009 | Berg et al. |
| 2010/0171093 A1 | 7/2010 | Kabir |

FOREIGN PATENT DOCUMENTS

| | | |
|---|---|---|
| JP | 2002117791 A | 4/2002 |
| JP | 2002203473 A | 7/2002 |
| JP | 2002289086 A | 10/2002 |
| JP | 2003115257 A | 4/2003 |
| JP | 2003115259 A | 4/2003 |
| JP | 2003249163 A | 9/2003 |
| JP | 2004055157 A | 2/2004 |
| JP | 2004261875 A | 9/2004 |
| JP | 2005116469 A | 4/2005 |
| JP | 2006224296 A | 8/2006 |
| WO | WO03055793 A1 | 7/2003 |
| WO | WO03078305 A1 | 9/2003 |
| WO | WO2004042830 A1 | 5/2004 |
| WO | WO2004070854 A1 | 8/2004 |
| WO | WO2004075275 A1 | 9/2004 |
| WO | WO2004079450 A1 | 9/2004 |
| WO | WO2004087564 A1 | 10/2004 |
| WO | WO2004096699 A1 | 11/2004 |
| WO | WO2004109815 A1 | 12/2004 |
| WO | WO2005112126 A1 | 11/2005 |
| WO | WO2006115453 A1 | 11/2006 |
| WO | WO2007053202 A2 | 5/2007 |

OTHER PUBLICATIONS

Shan, B. et al., "Ab initio study of Schottky barriers at metal-nanotube contacts", Physical Review B, vol. 70 (Dec. 9, 2004), pp. 233405.1-233405.4.

Sinnott, S. B. et al., "Model of carbon nanotube growth through chemical vapor deposition", Chemical Physics Letters, vol. 315 (1999), pp. 25-30.

Stan, M. R. et al., "Molecular Electronics: From Devices and Interconnect to Circuits and Architecture", Proceedings of the IEEE, vol. 91, No. 11 (Nov. 2003), pp. 1940-1957.

Tanemura, M. et al., "Growth of aligned carbon nanotubes by plasma-enhanced chemical vapor deposition: Optimization of growth parameters", Journal of Applied Physics, vol. 90, No. 3 (Aug. 1, 2001), pp. 1529-1533.

Tang, Z. K. et al., "Mono-sized single-wall carbon nanotubes formed in channels of AlPO4-5 single crystal", Applied Physics Letters, vol. 73, No. 16 (Oct. 19, 1998), pp. 2287-2289.

Tans, S. J. et al., "Individual single-wall carbon nanotubes as quantum wires", Nature, vol. 386 (Apr. 3, 1997), pp. 474-477.

Teo, K. B. K. et al., "Characterization of plasma-enhanced chemical vapor deposition carbon nanotubes by Auger electron spectroscopy", J. Vac. Sci. Technol. B, vol. 20, No. 1 (Jan./Feb. 2002), pp. 116-121.

Teo, K. B. K. et al., "Plasma enhanced chemical vapour deposition carbon nanotubes/nanofibres—how uniform do they grow?", Nanotechnology, vol. 14, No. 2 (2003), pp. 204-211.

Thompson, S. et al., "A 90 nm Logic Technology Featuring 50nm Strained Silicon Channel Transistors, 7 layers of Cu Interconnects, Low k ILD, and 1 um2 SRAM Cell", IEDM: International Electron Devices Meeting (held at San Francisco, California on Dec. 8-11, 2002) Technical Digest, (Aug. 12, 2002), pp. 61-64.

Tseng, Y. et al., "Monolithic Integration of Carbon Nanotube Devices with Silicon MOS Technology", Nano Letters, vol. 4, No. 1 (2004), pp. 123-127.

Vander Wal, R. L. et al., "Diffusion flame synthesis of single-walled carbon nanotubes", Chemical Physics Letters, vol. 323 (2000), pp. 217-223.

Yang, R. T. et al., "Mechanism of Carbon Filament Growth on Metal Catalysts", Journal of Catalysis, vol. 115 (1989), pp. 52-64.

Yang, X. et al., "Fabrication and Characterization of Carbon Nanofiber-Based Vertically Integrated Schottky Barrier Junction Diodes", Nano Letters, vol. 3, No. 12 (2003), pp. 1751-1755.

Yao, Y. et al., "Cross-sectional TEM investigation of nickel-catalysed carbon nanotube films grown by plasma-enhanced CVD", Journal of Microscopy, vol. 219, Pt. 2 (Aug. 2005), pp. 69-75.

Ye, Q. et al., "Large-Scale Fabrication of Carbon Nanotube Probe Tips for Atomic Force Microscopy Critical Dimension Imaging Applications", Nano Letters, vol. 4, No. 7 (May 24, 2004), pp. 1301-1308.

International Search Report of the PCT/SE2006/000487, mailed Sep. 1, 2006, 16 pages.

International Preliminary Report on Patentability for PCT Application No. PCT/SE2006/000487, mailed Apr. 13, 2007, 12 pages.

International Search Report for PCT Application No. PCT/IB2006/004279, mailed Apr. 24, 2008, 3 pages.

International Preliminary Report on Patentability and Written Opinion for PCT/IB2006/004279, mailed May 14, 2008, 7 pages.

International Search Report and Written Opinion for PCT Application No. PCT/SE2006/000983, mailed Feb. 12, 2007, 12 pages.

International Search Report and Written Opinion for PCT Application No. PCT/SE2007/000951, mailed Feb. 6, 2008, 9 pgs.

International Preliminary Report on Patentability for PCT Application No. PCT/SE2007/000951, mailed Feb. 6, 2008, 10 pages.

International Search Report and Written Opinion for PCT Application No. PCT/SE2008/000506, mailed Jan. 30, 2009, 10 pages.

International Preliminary Report on Patentability for PCT Application No. PCT/SE2008/000506, mailed Mar. 16, 2010, 8 pages.

First Notification of Office Action for Application No. 200680035406.7, dated Jun. 17, 2010, 10 pages.

Communication pursuant to Article 94(3) EPC for Application No. 06 850 481.0, dated Mar. 29, 2011, 7 pages.

Hertel, T. et al., "Manipulation of Individual Carbon Nanotubes in Their Interaction with Surfaces", J. Phys. Chem. B, vol. 102, No. 6 (1998), pp. 910-915.

Hoenlein, W. et al., "Carbon nanotubes for microelectronics: status and future prospects", Materials Science and Engineering C, vol. 23 (2003), pp. 663-669.

Iijima, S. et al., "Carbon nanotubes: past, present, and future", Physica B, vol. 323 (2002), pp. 1-5.

Javey, A. et al., "Carbon Nanotube Field-Effect Transistors with Integrated Ohmic Contacts and High-κ Gate Dielectrics", Nano Letters, vol. 4, No. 3 (Jan. 10, 2004), pp. 447-450.

Kabir, M. S., "Towards the Integration of Carbon Nanostructures into CMOS Technology", Thesis for the Degree of Doctor of Philosophy, Department of Microtechnology and Nanoscience, Chalmers University of Technology, Goteborg, Sweden, (Aug. 2005).

Kabir, M. S. et al., "Fabrication of individual vertically aligned carbon nanofibres on metal substrates from prefabricated catalyst dots", Nanotechnology, vol. 17, No. 3 (Jan. 10, 2006), pp. 790-794.

Japanese Office Action issued in JP 2008-508795 on Sep. 11, 2011, English Translation, 6 pages.

Kabir, M. S. et al., "Plasma-enhanced chemical vapour deposition growth of carbon nanotubes on different metal underlayers", Nanotechnology, vol. 16, No. 4 (Feb. 11, 2005), pp. 458-466.

Kempa, K. et al., "Photonic crystals based on periodic arrays of aligned carbon nanotubes", Nano Letters, vol. 3, No. 1 (2003), pp. 13-18.

Khomutov, G. B. et al., "Interfacial nanofabrication strategies in development of new functional nanomaterials and planar supramolecular nanostructures for nanoelectronics and nanotechnology", Microelectronic Engineering, vol. 69 (2003), pp. 373-383.

Kiselev, N. A. et al., "Carbon micro- and nanotubes synthesized by PE-CVD technique: Tube structure and catalytic particles crystallography", Carbon, vol. 42 (2004), 149-161.

Klein, D. L. et al., "An approach to electrical studies of single nanocrystals", App. Phys. Lett., vol. 68, No. 18 (Apr. 29, 1996), pp. 2574-2576.

Kong, J. et al., "Chemical vapor deposition of methane for single-walled carbon nanotubes", Chemical Physics Letters, vol. 292 (1998), pp. 567-574.

Kreupl, F. et al., "Carbon nanotubes in interconnect applications", Microelectronic Engineering, vol. 64 (2002), pp. 399-408.

Kuang, M. H. et al., "Catalytically active nickel {110} surfaces in growth of carbon tubular structures", Applied Physics Letters, vol. 76, No. 10 (Mar. 6, 2000), pp. 1255-1257.

Lacerda, R. G. et al., "Growth of high-quality single-wall carbon nanotubes without amorphous carbon formation", Applied Physics Letters, vol. 84, No. 2 (Jan. 12, 2004), pp. 269-271.

Laplaze, D. et al., "Carbon nanotubes: the solar approach", Carbon, vol. 36, No. 5-6 (1998), pp. 685-688.

Lee, B. et al., "A Novel SET/MOSFET Hybrid Static Memory Cell Design", IEEE Transactions on Nanotechnology, vol. 3, No. 3 (Sep. 2004), pp. 377-382.

Lee, S. B. et al., "Characteristics of multiwalled carbon nanotube nanobridges fabricated by poly(methylmethacrylate) suspended dispersion", J. Vac. Sci. Technol. B., vol. 20, No. 6 (Nov./Dec. 2002), pp. 2773-2776.

Lee, S. W. et al., "A Three-Terminal Carbon Nanorelay", Nano Letters, vol. 4, No. 10 (Jul. 15, 2004), pp. 2027-2030.

Li, J. et al., "Carbon Nanotube Interconnects: A Process Solution", Proceedings of the 2003 IEEE International, (2003), 271-272.

Li, M. et al., "Low-temperature synthesis of carbon nanotubes using corona discharge plasma reaction at atmospheric pressure", Journal of Materials Science Letters, vol. 22 (2003), pp. 1223-1224.

Liao, K. et al., "Effects of Ni-catalyst characteristics on the growth of carbon nanowires", Carbon, vol. 42 (2004), pp. 509-514.

Liu, Z. et al., "Porous silicon: a possible buffer layer for diamond growth on silicon substrates", Materials Research Society Symposium Proceedings, vol. 358 (1995), pp. 805-809.

Lundstrom, M., "A Top-Down Look at Bottom-Up Electronics", 2003 Symposium on VLSI Circuits Digest of Technical Papers, (2003), pp. 5-8.

Maeng, S. L. et al., "A carbon based bottom gate thin film transistor", Diamond and Related Materials, vol. 9 (2000), pp. 805-810.

Martel, R. et al., "Ambipolar Electrical Transport in Semiconducting Single-Wall Carbon Nanotubes", Physical Review Letters, vol. 87, No. 25 (Dec. 17, 2001), pp. 256805.1-256805.4.

Martel, R., "Nanotube Electronics: High-performance transistors", Nature Materials, vol. 1 (Dec. 2002), pp. 203-204.

Merkulov, V. I. et al., "Growth rate of plasma-synthesized vertically aligned carbon nanofibers", Chemical Physics Letters, vol. 361 (2002), pp. 492-498.

Meyyappan, M. et al., "Carbon nanotube growth by PECVD: a review", Plasma Sources Sciences and Technology, vol. 12 (2003), pp. 205-216.

Morjan, R. E. et al., "Selective growth of individual multiwalled carbon nanotubes", Current Applied Physics, vol. 4, No. 6 (Nov. 2004), pp. 591-594.

Nabet, B. et al., "Local Variation of Metal-Semiconducting Carbon Nanotube Contact Barrier Height", Proceedings of the 2002 2nd IEEE Conference on Nanotechnology, IEEE-NANO 2002, (Aug. 28, 2002), pp. 435-438.

Naeemi, A. et al., "Monolayer Metallic Nanotube Interconnects: Promising Candidates for Short Local Interconnects", IEEE Electron Device Letters, vol. 26, No. 8 (Aug. 2005), pp. 544-546.

Natsuki, T. et al., "Effects of carbon nanotube structures on mechanical properties", Applied Physics A—Materials Science & Processing, vol. 79 (Feb. 27, 2004), pp. 117-124.

Ng, H. T. et al., "Growth of Carbon Nanotubes: A Combinatorial Method to Study the Effects of Catalysts and Underlayers", J. Phys. Chem. B, vol. 107, No. 33 (2003), pp. 8484-8489.

Nihei, M. et al., "Carbon nanotube vias for future LSI interconnects", Proceedings of the IEEE 2004 International Interconnect Technology Conference, (2004), pp. 251-253.

Nikolaev, P. et al., "Gas-phase catalytic growth of single-walled carbon nanotubes from carbon monoxide", Chemical Physics Letters, vol. 313 (1999), pp. 91-97.

Nolan, P. E. et al., "Carbon Deposition and Hydrocarbon Formation on Group VIII Metal Catalysts", J. Phys. Chem. B, vol. 102 (1998), 4165-4175.

Nuzzo, R. G. et al., "Adsorption of Bifunctional Organic Disulfides on Gold Surfaces", J. Am. Chem. Soc., vol. 105 (1983), pp. 4481-4483.

Oberlin, A. et al., "High resolution electron microscope observations of graphitized carbon fibers", Carbon, vol. 14 (1976), pp. 133-135.

Odom, T. W. et al., "Atomic structure and electronic properties of single-walled carbon nanotubes", Nature, vol. 391 (Jan. 1, 1998), pp. 62-64.

Ondrejcek, M. et al., "Low energy electron microscopy investigations of kinetics and energetics on clean close-packed metal surfaces", Journal of Physics: Condensed Matter, vol. 17 (Apr. 8, 2005), pp. S1397-S1406.

Popov, V. N., "Carbon nanotubes: properties and application", Materials Science and Engineering R., vol. 43 (2004), pp. 61-102.

Prylutskyy, Y. I. et al., "Molecular dynamics simulation of mechanical, vibrational and electronic properties of carbon nanotubes", Computational Materials Science, vol. 17 (2000), pp. 352-355.

Raffaelle, R. P. et al., "Carbon nanotubes for power applications", Materials Science and Engineering B, vol. 116 (2005), pp. 233-243.

Raja, T. et al., "A Tutorial on the Emerging Nanotechnology Devices", Proceedings of the 17th International Conference on VLSI Design (VLSID'04), (2004), 18 pages.

Saito, R. et al., "Chapters 1.1 and 1.2: Carbon Materials", Physical Properties of Carbon Nanotubes, Imperial College Press, London, England, (1998), pp. 1-15.

Saito, Y. et al., "Interlayer spacings in carbon nanotubes", Physical Review B, vol. 48, No. 3 (Jul. 15, 1993), pp. 1907-1909.

Sapmaz, S. et al., "Carbon nanotubes as nanoelectromechanical systems", Physical Review B, vol. 67 (2003), pp. 235414.1-235414.7.

Sato, S. et al., "Carbon nanotube growth from titanium-cobalt bimetallic particles as a catalyst", Chemical Physics Letters, vol. 402 (Dec. 22, 2004), pp. 149-154.

Adams, D. P. et al., "Microstructure and residual stress of very thin Mo films", Thin Solid Films, vol. 266 (1995), pp. 52-57.

Ajayan, P. M., "How does a nanofibre grow?", Nature, vol. 427 (Jan. 29, 2004), pp. 402-403.

Avouris, P. et al., "Carbon Nanotube Electronics", Proceedings of the IEEE, vol. 91, No. 11 (Nov. 2003), pp. 1772-1784.

Awano, Y. et al., "Carbon nanotube technologies for future ULSIs", 2003 International Symposium on VLSI Technology, Systems, and Applications, (2003), pp. 40-41.

Bachtold, A. et al., "Logic Circuits with Carbon Nanotube Transistors", Science, vol. 294 (Nov. 9, 2001), pp. 1317-1320.

Baker, R. T. K., "Catalytic growth of carbon filaments", Carbon, vol. 27, No. 3 (1989), pp. 315-323.

Baughman, R. H. et al., "Carbon Nanotubes—the Route Toward Applications", Science, vol. 297 (Aug. 2, 2002), pp. 787-792.

Baylor, L. R. et al., "Field emission from isolated individual vertically aligned carbon nanocones", Journal of Applied Physics, vol. 91, No. 7 (Apr. 1, 2002), pp. 4602-4606.

Bertness, K. A. et al., "Formation of AlN and GaN nanocolumns on Si(111) using molecular beam epitaxy with ammonia as a nitrogen source", Phys. Stat. Sol. (c), vol. 2, No. 7 (Feb. 8, 2005), pp. 2369-2372.

Blase, X. et al., "Hybridization Effects and Metallicity in Small Radius Carbon Nanotubes", Physical Review Letters, vol. 72, No. 12 (Mar. 21, 1994), pp. 1878-1881.

Burke, P. J., "AC performance of nanoelectronics: towards a ballistic THz nanotube transistor", Solid-State Electronics, vol. 48 (2004), 1981-1986.

Cassell, A. M. et al., "Large Scale CVD Synthesis of Single-Walled Carbon Nanotubes", J. Phys. Chem. B, vol. 103 (1999), pp. 6484-6492.

Caughman, J. B. O. et al., "Growth of vertically aligned carbon nanofibers by low-pressure inductively coupled plasma-enhanced chemical vapor deposition", Applied Physics Letters, vol. 83, No. 6 (Aug. 11, 2003), pp. 1207-1209.

Cerofolini, G. F. et al., "A hybrid approach to nanoelectronics", Nanotechnology, vol. 16 (May 12, 2005), pp. 1040-1047.

Chen, B. et al., "Heterogeneous Single-Walled Carbon Nanotube Catalyst Discovery and Optimization", Chem. Mater., vol. 14 (2002), pp. 1891-1896.

Chhowalla, M. et al., "Growth process conditions of vertically aligned carbon nanotubes using plasma enhanced chemical vapor deposition", Journal of Applied Physics, vol. 90, No. 10 (Nov. 15, 2001), pp. 5308-5317.

Choi, Y. C. et al., "Effect of surface morphology of Ni thin film on the growth of aligned carbon nanotubes by microwave plasma-enhanced chemical vapor deposition", Journal of Applied Physics, vol. 88, No. 8 (Oct. 15, 2000), pp. 4898-4903.

Chopra, N. et al., "Control of Multiwalled Carbon Nanotube Diameter by Selective Growth on the Exposed Edge of a Thin Film Multilayer Structure", Nano Letters, vol. 2, No. 10 (2002), 1177-1181.

Chopra, N. et al., "Incident angle dependence of nanogap size in suspended carbon nanotube shadow lithography", Nanotechnology, vol. 16 (Dec. 10, 2004), pp. 133-136.

Ciraci, S. et al., "Functionalized carbon nanotubes and device applications", Journal of Physics: Condensed Matter, vol. 16 (2004), pp. R901-R960.

Colomer, J. F. et al., "Large-scale synthesis of single-wall carbon nanotubes by catalytic chemical vapor deposition (CCVD) method", Chemical Physics Letters, vol. 317 (2000), pp. 83-89.

Conway, N. M. J. et al., "Defect and disorder reduction by annealing in hydrogenated tetrahedral amorphous carbon", Diamond and Related Materials, vol. 9 (2000), pp. 765-770.

Coquay, P. et al., "Carbon Nanotubes by a CVD Method. Part II: Formation of Nanotubes from (Mg, Fe)O Catalysts", J. Phys. Chem. B, vol. 106, No. 51 (2002), pp. 13199-13210.

Cui, H. et al., "Initial growth of vertically aligned carbon nanofibers", Applied Physics Letters, vol. 84, No. 20 (May 17, 2004), pp. 4077-4079.

Davis, J. F. et al., "High-Q Mechanical Resonator Arrays Based on Carbon Nanotubes", Nanotechnology, vol. 2 (Aug. 2003), pp. 635-638.

Dekker, C., "Carbon nanotubes as molecular quantum wires", Physics Today, (May 1999), pp. 22-28.

Delzeit, L. et al., "Growth of carbon nanotubes by thermal and plasma chemical vapour deposition processes and applications in microscopy", Nanotechnology, vol. 13 (2002), pp. 280-284.

Delzeit, L. et al., "Growth of multiwall carbon nanotubes in an inductively coupled plasma reactor", Journal of Applied Physics, vol. 91, No. 9 (May 1, 2002), pp. 6027-6033.

Delzeit, L. et al., "Multilayered metal catalysts for controlling the density of single-walled carbon nanotube growth", Chemical Physics Letters, vol. 348 (2001), pp. 368-374.

Delzeit, L. et al., "Multiwalled Carbon Nanotubes by Chemical Vapor Deposition Using Multilayered Metal Catalysts", J. Phys. Chem. B., vol. 106 (2002), pp. 5629-5635.

Derycke, V. et al., "Carbon Nanotube Inter- and Intramolecular Logic Gates", Nano Letters, vol. 1, No. 9 (Sep. 2001), pp. 453-456.

Dong, L. et al., "Effects of catalysts on the internal structures of carbon nanotubes and corresponding electron field-emission properties", Applied Physics A—Materials Science & Processing, vol. 78 (2004), pp. 9-14.

Duesberg, G. S. et al., "Growth of Isolated Carbon Nanotubes with Lithographically Defined Diameter and Location", Nano Letters, vol. 3, No. 2 (2003), pp. 257-259.

Doraiswami, R. "Nano Nickel-Tin Interconnects and Electrodes for Next Generation 15 Micron Pitch Embedded Bio Fluidic Sensors in FR4 Substrates." 1-4244-0152-6, 2006 IEEE, 2006 Electronic Components and Technology Conference, pp. 1323-1325.

Emmenegger, C. et al., "Carbon nanotube synthesized on metallic substrates", Applied Surface Science, vol. 162-163 (2000), pp. 452-456.

Eres, G. et al., "In situ control of the catalyst efficiency in chemical vapor deposition of vertically aligned carbon nanotubes on predeposited metal catalyst films", Applied Physics Letters, vol. 84, No. 10 (Mar. 8, 2004), pp. 1759-1761.

Ferrari, A. C. et al., "Is stress necessary to stabilise sp3 bonding in diamond-like carbon?", Diamond and Related Materials, vol. 11 (2002), pp. 994-999.

Frank, S. et al., "Carbon nanotube quantum resistors", Science, vol. 280 (Jun. 12, 1998), pp. 1744-1746.

Franklin, N. R. et al., "Integration of suspended carbon nanotube arrays into electronic devices and electromechanical systems", Applied Physics Letters, vol. 81, No. 5 (Jul. 29, 2002), pp. 913-915.

Fuhrer, M. S. et al., "High-Mobility Nanotube Transistor Memory", Nano Letters, vol. 2, No. 7 (2002), pp. 755-759.

Gerdes, S. et al., "Combing a carbon nanotube on a flat metal-insulator-metal nanojuction", Europhysics Letters, vol. 48, No. 3 (1999), pp. 292-298.

Graham, A. P. et al., "How do carbon nanotubes fit into the semiconductor roadmap?", Applied Physics A—Materials Science & Processing, vol. 80 (Mar. 11, 2005), pp. 1141-1151.

Guillorn, M. A. et al., "Individually addressable vertically aligned carbon nanofiber-based electrochemical probes", Journal of Applied Physics, vol. 91, No. 6 (Mar. 15, 2002), pp. 3824-3828.

Guo, J. et al., "Assessment of Silicon MOS and Carbon Nanotube FET Performance Limits Using a General Theory of Ballistic Transistors", International Electron Devices Meeting (IEDM) Digest, (2002), pp. 711-714.

Guo, T. et al., "Catalytic growth of single-walled nanotubes by laser vaporization", Chemical Physics Letters, vol. 243 (1995), pp. 49-54.

Hash, D. B. et al., "An investigation of plasma chemistry for dc plasma enhanced chemical vapour deposition of carbon nanotubes and nanofibres", Nanotechnology, vol. 16 (Apr. 19, 2005), pp. 925-930.

Hausler, K. et al., "Ordering of nanoscale InP islands on strain-modulated InGaP buffer layers", Solid-State Electronics, vol. 40, Nos. 1-8 (1996), pp. 803-806.

Heidari, B. et al., "Large scale nanolithography using nanoimprint lithography", J. Vac. Sci. Technol. B, vol. 17, No. 6 (Nov./Dec. 1999), pp. 2961-2964.

Heinze, S. et al., "Carbon Nanotubes as Schottky Barrier Transistors", Physical Review Letters, vol. 89, No. 10 (Sep. 2, 2002), pp. 106801.1-106801.4.

Helveg, S. et al., "Atomic-scale imaging of carbon nanofibre growth", Nature, vol. 427 (Jan. 29, 2004), pp. 426-429.

* cited by examiner

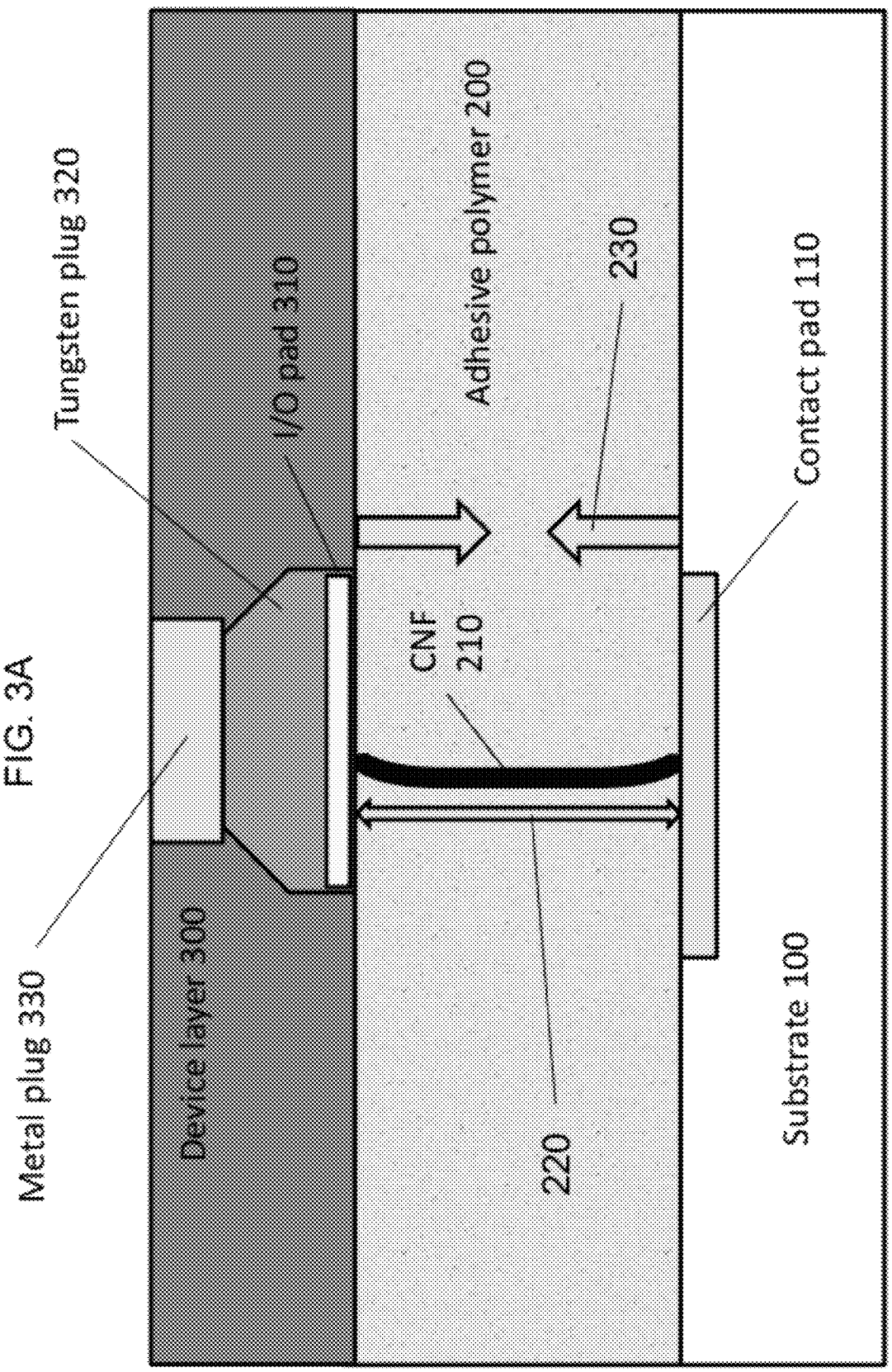

701
Grow nanostructures on a conducting substrate with a plurality of intermediate layers between the conducting substrate and the nanostructures 702
Spincoat the grown nanostructures with an adhesive polymer to form a carrier with embedded nanostructures 703
Polish the carrier with embedded nanostructures to achieve a uniform desired length for the nanostructures 704
Dice the carrier to create individual pads, having nanostructures embedded in a film 705
Lift the individual pads 706
Apply and position an individual pad between a first conductive surface and a second conductive surface so that the nanostructures are oriented perpendicular to both conductive surfaces 707
Cure the pad to create a bond between one end of the nanostructures and the first conductive surface and a bond between the other end of the nanostructures and the second conductive surface, wherein the bond is electrically or thermally conductive

FIG. 7

901 — Growth of carbon nanostructures (CNS) with predefined density of CNS/μm on metallic underlayer using a CVD-process on wafer 902 — Spincoating of the grown CNS's with adhesive polymer (optional)

903 — Polishing the grown and spincoated structure to achieve desired and uniform length (optional)

904 — Dicing of the spin coated wafer to create die

905 — Mount the die onto a substrate for bonding.

FIG. 9

CONNECTING AND BONDING ADJACENT LAYERS WITH NANOSTRUCTURES

CLAIM OF PRIORITY

This is a continuation application which claims the priority under U.S.C. §120 to U.S. application Ser. No. 12/210,091, filed Sep. 12, 2008, now U.S. Pat. No. 8,106,517 issued Jan. 31, 2012, which claims benefit under 35 U.S.C. §119 of U.S. provisional patent application Ser. Nos. 60/971,859, filed Sep. 12, 2007, and 60/974,045, filed Sep. 20, 2007, all of which are incorporated by reference herein their entireties.

TECHNICAL FIELD

The technology described herein generally relates to nanostructures, and more particularly relates to use of nanostructures to connect and bond adjacent layers of conductive materials.

BACKGROUND

There are many instances in the production and manufacture of electronic devices that a layer of material, such as present in one component, is required to be attached—often at specific locations—to a substrate, such as a wafer or die. In such instances, the integrity of the attachment, whether it is mechanically, thermally or electrically, can be critical for the performance of the device.

Examples include: attaching or bonding a flip-chip to an underlayer (a substrate such as a die); fine-pitch chip-on-flex technology as used in LCD manufacture; and wafer-level bumping for creating electrical contacts at a fine pitch. In all such applications, current technologies are experiencing significant limitations, due in part to the increasing demands for miniaturization of electronic devices.

use of "flip chip" technology is growing rapidly and the technology is currently used in devices such as mobile phones, MP3-players, smart cards, displays, computer peripherals. However, in terms of complexity and product cost, flip chip technology has drawbacks, due to the requirements of complex processes that involve bonding and connecting the flip chip to the die. These processes include solder flux coating, chip/board arranging, solder bump reflow processes, flux removal processes, underfilling, and cure processes.

The techniques used in bonding and connecting flip-chips are moving towards increasingly greater numbers of I/O contacts, and finer pitches between the contacts. See, for example, "Anisotropic Conductive Film for Flipchip Applications: An Introduction," by Peter J. Opdahl, available at www.flipchips.com/tutorial05.html, incorporated herein by reference.

As an alternative to solder bumping, anisotropic conductive film (ACF) has emerged as a lead-free, environmentally-friendly, and flux-less bonding solution consisting of conductive particles dispersed in a polymer matrix, such as an adhesive resin. ACF works by trapping conductive particles between a conductive surface, such as a conductive bump on a flip chip, and another conductive surface, such as a conductive pad on a substrate corresponding to the conductive bump on the flip chip, while insulating adjacent particles from one another.

During the last few decades, ACF has been widely used for packaging technologies in the flat panel display industry to make electrical and mechanical connections from an integrated circuit driver to a glass substrate in a display. Lately, ACF has proven to be a popular alternative to other direct chip-attach technologies, in order to satisfy requirements of finer pitch at lower dimensions. For the ACF material this means making the conductive particles as small as possible, creating high particle density, and ensuring extremely evenly distributed particles within the ACF. In addition, the flow of the polymer matrix typically has to be as well-controlled as possible. Currently, particles as small as 3.5 μm in size are used in demanding applications.

It has long been recognized that ACF suffers from a number of limitations. If the particles are too large, or if there are too many particles, there is a risk of creating a short circuit between two neighboring bumps on the flip chip. This means that there are limitations on the minimum possible pitch between particles, since a short-circuit can arise if the particles are too close to each other. This is particularly evident in, e.g., the display industry, where black dots will appear when a short-circuit occurs. As there is no clear way of predicting with precision the uniformity of particle distribution within the polymer matrix, the risk of short-circuiting is always present. The impact of avoiding the risk of short-circuiting due to the particles is that the maximum possible number of contacts (I/O's) is limited, and thus the maximum possible pitch is limited when connecting a flip-chip using ACF.

Chip On Flex (COF), is a related technology that also utilizes ACF, and triggers similar issues to "flip-chip" technologies as the demand (particularly in the LCD industry) increases for finer pitch products (less than the 40-50 μm in current products) in order to meet cost and size requirements. There are two main issues in fine-pitch COF packaging that arise with the current bonding process: lead breakage and misalignment.

Since lead breakage during the assembly process can happen at any instance, and at any position, a visual inspection is almost impossible. Lead breakage can occur when there is a lack of trapped conductive particles between the two conductive surfaces; a trapped particle count less than one creates a high probability of an open electrical connection, which leads to electrical failure. In order to avoid that problem, the particle density must be increased, which is accomplished by reducing the diameter of the particles. If the lead pitch of the COF is 40 μm, an anisotropic conductive adhesive (ACA) with a particle diameter of less than 3 μm can be employed to achieve 99.95% chance of a good electrical connection (at least one trapped particle).

However, even at that high rate of connection integrity, the margin of error cannot be ignored. For example, for packages with 400 bumps, one out of five chips may have an open (disconnected) bump/lead joint. Moreover, if the magnitude of gap variation between bumps and leads exceeds 3 μm, an open joint failure can occur even with normal joints with trapped particles. Therefore, overall, the application of an anisotropic conducting adhesive (ACA) to fine-pitch COF interconnection requires reduced particle size and more accurate control of bump/lead height and chip/film coplanarity.

Misalignment also becomes a greater risk at finer lead pitches, since finer pitches require higher-precision control over the alignment between the film and the conductive surfaces. The existing tolerance requirement eventually needs to be replaced with a new standard for satisfactory yields. The causes of misalignment in the COF assembly process are various and may be in the film, chip, bonding equipment, and so on. The bonding tolerance relates to the nature of variation.

Thus, the main problems with ACF can be summed up as: (1) the need for uniform distributed particle size; (2) the need for control of bonding pressure to break the surface coatings of the particles and to create contacts; (3) limitations in size of the particles with respect to distribution of particles—one cannot go down to sub micron level; and (4) manufacturing limitations—one cannot manufacture at the sub micron level with good and reproducible uniformity. Accordingly, there is a need for a better way of making connections between a chip and a substrate and of attaching a chip to a substrate.

Wafer-level bumping is subject to similar considerations. The need for "bumps" for creation of the electrical contacts through distribution or contact channels with lower dimension and finer pitch demands ever greater fidelity of manufacture. Electrical connections are created by bumps, but there are limitations in the size of those bumps; it is not possible to go down to sub micron level with current manufacturing processes, which are constrained in the number of bumps per unit area. Thus, a number of distribution channels are suffering from the constraints of creating the bumps.

The discussion of the background herein is included to explain the context of the technology. This is not to be taken as an admission that any of the material referred to was published, known, or part of the common general knowledge as at the priority date of any of the claims found appended hereto.

Throughout the description and claims of the specification the word "comprise" and variations thereof, such as "comprising" and "comprises", is not intended to exclude other additives, components, integers or steps.

SUMMARY

The present disclosure provides for an apparatus, comprising: a first conductive surface; a second conductive surface; and two or more nanostructures, wherein each of the two or more nanostructures is oriented parallel to another of the two or more nanostructures, and wherein the two or more nanostructures comprise two or more interdiffused materials, the two or more interdiffused materials including at least one material that affects a morphology of the two or more nanostructures and at least one material that affects an electrical property of an interface between the first conductive surface, and wherein a first bond exists between a first end of each of the two or more nanostructures and the first conductive surface, and wherein the two or more nanostructures are oriented perpendicular to the first conductive surface, and wherein a second bond exists between a second end of each of the two or more nanostructures and the second conductive surface, and wherein the two or more nanostructures are oriented perpendicular to the second conductive surface.

A method of connecting a first conductive surface to a second conductive surface using a nanostructure assembly, the method comprising: creating a nanostructure assembly by: depositing one or more intermediate layers on the conducting substrate, wherein at least one of the plurality of intermediate layers comprises material selected from the group consisting of amorphous silicon and germanium; depositing a catalyst layer on the one or more intermediate layers; without first annealing the substrate, causing the substrate to be heated to a temperature at which the nanostructure can form; and growing two or more nanostructures on the catalyst layer at the temperature, wherein at least one of the one or more intermediate layers are interdiffused with the catalyst layer, and wherein the catalyst layer and the at least one of the one or more intermediate layers that are interdiffused are present in the nanostructure; coating the nanostructure assembly with an insulating material to form a film with embedded nanostructures; polishing the film to achieve a uniform desired length for the two or more nanostructures of the nanostructure assembly; dicing the film to create one or more individual pads; lifting the pads from the conducting substrate; inserting the one or more pads between the first conductive surface and the second conductive surface; and curing the one or more pads, thereby bonding the first conductive surface to a first surface of the one or more pads and bonding the second conductive surface to a second surface of the one or more pads. The insulating material may be a polymer, such as an adhesive polymer.

A method of connecting a first conductive surface to a second conductive surface using a nanostructure assembly, the method comprising: creating a nanostructure assembly by: depositing one or more intermediate layers on the first conductive surface, wherein at least one of the plurality of intermediate layers comprises material selected from the group consisting of amorphous silicon and germanium; depositing a catalyst layer on the one or more intermediate layers; without first annealing the substrate, causing the substrate to be heated to a temperature at which the nanostructure can form; and growing two or more nanostructures on the catalyst layer at the temperature, wherein at least one of the one or more intermediate layers are interdiffused with the catalyst layer, and wherein the catalyst layer and the at least one of the one or more intermediate layers that are interdiffused are present in the nanostructure; coating the nanostructure assembly with an insulating material to form a film with embedded nanostructures on the first conductive surface; polishing the film to achieve a uniform desired length for the two or more nanostructures of the nanostructure assembly; dicing the film and the first conductive surface to create one or more individual pads, each pad comprising a section of the film and a section of the first conductive surface; applying one or more pads to the second conductive surface; and curing the one or more pads, thereby bonding the second conductive surface to a surface of the one or more pads. The insulating material may be a polymer, such as an adhesive polymer.

A method of connecting a first conductive surface to a second conductive surface using a nanostructure assembly, the method comprising: creating a nanostructure assembly by: depositing one or more intermediate layers, depositing a catalyst layer on the one or more intermediate layers; without first annealing the substrate, causing the substrate to be heated to a temperature at which the nanostructure can form; and growing two or more nanostructures on the catalyst layer at the temperature, wherein at least one of the one or more intermediate layers are interdiffused with the catalyst layer, and wherein the catalyst layer and the at least one of the one or more intermediate layers that are interdiffused are present in the nanostructure; coating the nanostructures with metal deposition to form metal embedded nanostructures on the first conductive surface; coating the nanostructure assembly with an insulating material to form a film with embedded nanostructures on the first conductive surface; polishing the film to achieve a uniform desired length for the two or more nanostructures of the nanostructure assembly; dicing the film and the first conductive surface to create one or more individual pads, each pad comprising a section of the film and a section of the first conductive surface; applying one or more pads to the second conductive surface; and curing the one or more pads, thereby bonding the second conductive surface to a surface of the one or more pads. The insulating material may be a polymer, such as an adhesive polymer.

BRIEF DESCRIPTION OF THE DRAWINGS

FIGS. 3A, 3B: bonding and electrical contacting of a die to a substrate using carbon nanofibers in a matrix, after curing.

FIG. 7 shows a flow-chart of a process as described herein;

FIG. 9 shows a flow-chart of a process as described herein.

DETAILED DESCRIPTION

Figure 1:
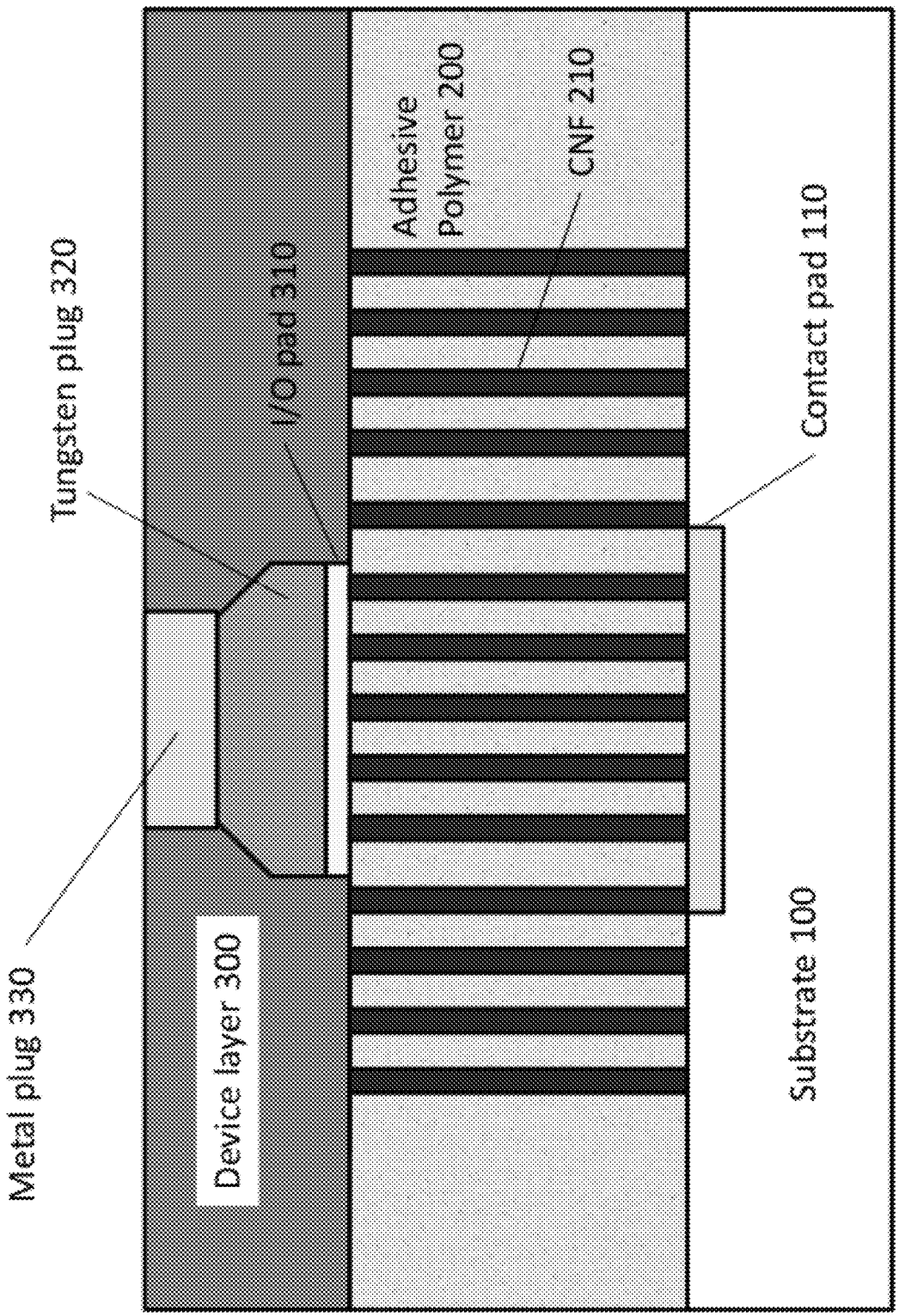
FIG. 1: bonding and electrical contacting of a die to a substrate using carbon nanofibers in a matrix-principle.

The instant technology is directed to methods of connecting two surfaces or layers by bonding nanostructures to contact locations on the two surfaces or layers, thereby creating mechanical, electrical, or thermal connections between the two surfaces or layers. By such methods, the pitch of the contact locations may be within the inclusive range of 2 nm to 1 mm. The instant technology further includes an apparatus comprising a first conductive surface or layer, a second conductive surface or layer, and a nanostructure assembly bonded to and positioned in between the two conductive surfaces or layers, such that the nanostructures of the nanostructure assembly are oriented perpendicular to the two conductive surfaces or layers.

In other aspects of the technology, a bonding layer is formed by growing nanostructure, such as carbon nanostructures (CNS), on metallic underlayers formed on a substrate. The substrate may comprise one or more layers of metal, semiconductive materials, or insulating materials, or combinations thereof. The nanostructures grow perpendicular to the substrate surface. The nanostructures can be coated in a carrier such as a polymer, e.g., an adhesive polymer. The polymer may be a polyimide. The carrier may be an insulating material, or may be a flexible or rigid material. Optionally the nanostructures, coated or not, can be polished to provide uniform length. The resulting structures can be diced into individual films. Optionally, the film of polymer and nanostructures can be lifted from the substrate. The film can then be applied to the surface of a die to provide wafer contacts.

In still other aspects of the technology, a wafer bonding layer can include nanostructures, such as carbon nanostructures (CNS), held in a polymer coating such as herein described. The nanostructures extend perpendicularly to the top and bottom surfaces of the layer. The nanostructures can be grouped, with nanostructures within a group at a regular spacing, and groups at another regular (larger) spacing. Nanostructures within a group can be electrically connected, either by being placed in direct contact with a common electrode, or by being grown on metal underlayers that are electrically coupled. In contrast, nanostructures of separate groups are electrically isolated.

When "perpendicular" is used herein to describe an orientation between a nanostructure and a layer or surface, it is understood that the nanostructure is of the form of a wire, tube, or fiber, or similar structure, that has a longitudinal axis extending along its length, and it is the longitudinal axis that is disposed normal to the plane of a layer or surface. It is further to be understood that "perpendicular" encompasses small deviations from exact perpendicularity, such as for example an inclination of the longitudinal axis that is 88-90° with respect to the plane, or 85-90° with the respect to the plane.

In some embodiments, the nanostructures are generally rigid, such that the layer that contains them can be generally incompressible.

Examples of nanostructures include, but are not limited to, nanotubes, nanofibers, or nanowires. In particular, nanostructures found herein can be made of carbon based nanostructures such as carbon nanotube(s), carbon nanofiber(s), or carbon nanowire(s).

Nanostructures found herein can also be made of other materials such as metals, III-V, II-VI compounds, or combinations of elements from the periodic table of the elements. Examples of materials include semiconductors such as GaAs, InP, InGaAs, AlGaAs, nanowires such as silicon nanowires, alloys such as ZnO, ZnAlO, and any other binary or ternary alloys from which nanostructures can be formed.

Nanostructures consistent with applications herein can be grown/formed/deposited on substrates such as silicon, polysilicon, oxidized silicon, silicon nitride, germanium, silicon-germanium, GaAs, AlGaAs, GaN, InP, glass, polyimide, polymer, metals such as W, Mo, Ti, Cr, NiCr, Al, AlOx, Pt, Pd, Au, Cu, TiN, or any other metal from the periodic table, plastics, aluminium foil, alumina, papers, and high k materials such as HfO, ZrO, etc, For growth of the nanostructures, the catalyst can be of Ni, NiCr, Pd, Pt, Fe, Au, Co, or combinations of such metals, or alloys of different materials, for example bimetallic catalysts such as Co—V, Co—Ni, Fe—Ni, etc.

Chemical Vapor Deposition (CVD) is a typical method for growth of nanostructures for use with the technology described herein. However, there are different kinds of CVD methods that can be used, e.g., thermal CVD, PECVD, RPECVD, MOCVD (metallo-organic CVD), etc. or any other variants of CVD as is known by the skilled artisan. Particular methods of growth are described in U.S. patent application Ser. No. 11/412,060, "Controlled Growth of a Nanostructure on a Substrate," filed Apr. 25, 2006, which is incorporated herein by reference in its entirety.

Still further, the nanostructures herein can be formed from methods and materials, employing conditions, that permit control of various properties of the nanostructures once formed. Thus, the nanostructures used herein encompass nanostructures grown from substrates, and interface layers situated therebetween, having the following characteristics. The substrate is preferably a conducting layer such as a metal layer, which maybe disposed on a support. The support is typically a wafer of silicon or other semiconducting material, glass, or suitable flexible polymer used in thin film technology. The metal is preferably selected from the group consisting of molybdenum, tungsten, platinum, palladium, and tantalum. The thickness of the metal layer is preferably in the range 1 nm to 1 µm and even more preferably in the range 1 nm to 50 nm. The metal layer is preferably deposited by any one of several methods known in the art, including but not limited to: evaporative methods such as thermal or vacuum evaporation, molecular beam epitaxy, and electron-beam evaporation; glow-discharge methods such as any of the several forms of sputtering known in the art, and plasma processes such as plasma-enhanced CVD; and chemical processes including gas-phase processes such as chemical vapor deposition, and ion implantation, and liquid-phase processes such as electroplating, and liquid phase epitaxy. Examples of deposition technologies are found in *Handbook of Thin Film Deposition*, K. Seshan, Ed., Second Edition, (William Andrew, In, 2002).

The interface layers, also called intermediate layers or an intermediate layer, comprise one or more layers, in sequence, disposed upon the substrate. On top of the interface layers is a layer of catalyst. The nanostructure is grown from on top of the catalyst layer.

The interface layers may consist simply of a single layer of material. In this circumstance, the single layer can be silicon or germanium. The layers can be deposited in amorphous or crystalline forms by techniques such as evaporation, or sputtering. The thickness typically ranges from 1 nm to 1 μm and also in the range 1 nm to 50 nm.

The interface layers may comprise several layers of different materials and may be, arbitrarily, classified according to function. For example, the layers in the vicinity of the substrate are characterized as layers that influence the electrical properties of the interface. The layers in the vicinity of the catalyst are characterized as layers that influence the composition and properties such as electrical/mechanical properties of the nanostructure.

Various configurations of interface layers are compatible with the present invention. For example, a sequence of up to 3 layers may be deposited on the substrate, for the purpose of controlling the electrical properties of the interface. Such configurations include, but are not limited to: a sequence of insulator, conductor or semiconductor, and insulator; a sequence of insulator adjacent to the substrate, and a semiconducting layer; a sequence of semiconductor, insulator, semiconductor; a sequence of two insulating barrier layers adjacent to the substrate, and a semiconductor; a single layer of a metal that is different from the metal of the substrate; and a sequence of a metal that is different from the metal of the substrate, and a semiconducting layer. In such configurations, the insulator may be selected from the group consisting of: $SiO_x$, $Al_2O_3$, $ZrO_x$, $HfO_x$, $SiN_x$, $Al_2O_3$, $Ta_2O_5$, $TiO_2$, and ITO. The semiconductor may be silicon or germanium. The metal, where present, may be palladium, platinum molybdenum or tungsten. Where two layers of the same character are present, e.g., two semiconducting layers, it is not necessary that the layers have the same composition as one another.

The uppermost layer of the foregoing interface layers may itself abut against the catalyst layer. This is particularly the case where the uppermost layer is a semiconductor such as silicon or germanium. However, it is additionally possible for the foregoing interface layers to have disposed upon them a further layer or sequence of layers that lies between them and the catalyst layer. Such additional, or second, interface layers are thought of as controlling the properties and composition of the nanostructure. The second interface layers may be a pair of layers, such as a metal layer and on top thereof a semiconductor layer adjacent to the catalyst layer. Alternatively, the second interface layers may simply consist of a single layer of semiconductor. The metal layer, where present in the second interface layers, is preferably selected from the group consisting of tungsten, molybdenum, palladium, and platinum. The semiconducting layer in the second interface layers is preferably silicon or germanium.

The catalyst layer is typically a layer of metal or metal alloy, and may contain very fine particles of metal or metal alloy instead of being a continuous film. The catalyst layer preferably comprises a metal selected from the group consisting of nickel, palladium, iron, nickel-chromium alloy containing nickel and chromium in any proportions, and molybdenum.

The nanostructures typically have a multi-stack configuration of at least one material layer between the catalyst layer and the conducting substrate, wherein the material is not of the same kind as the catalyst and conducting substrate, and wherein the material controls the chemical reactions between the various layers. Thus, the growth of the nanostructures on different conducting substrates can be controlled. Thereby the morphology and properties of the grown structures as well as the tip materials of the grown structures can be controlled. The current technology can be extended to having several stacks of materials of different kinds (semiconducting, ferroelectric, magnetic, etc.) which can be used to control the properties at base/interface, body and the tip of the nanostructure. It is also possible that the nanostructure is grown upon a conducting layer which is itself deposited on a substrate that itself can be of any kind, such as conducting, insulating or semiconducting.

Typically, during growth of such nanostructures, some diffusion of the material of the intermediate layers into the nanostructures occurs. Such interdiffusion may transport the material of the intermediate layers all the way to the tip of the grown nanostructures. In some conditions, the diffused material is present as a narrow band; in others, the diffused material is spread out through the nanostructure.

The methods described herein are applicable in any assembly techniques for electronic components that include analog and/or digital electronic circuits. For example, such components may be found in: communications engineering, car/industrial electronics goods, consumer electronics, computing, digital signal processing and integrated products. Attaching technologies such as ball grid array (BGA), flip chip (FC) modules, CSP, WLP, FCOB, TCB may utilize the methods herein. Integrated Circuit (IC) types such as RFID, CMOS, BiCMOS, GaAS, AlGAAs, MMIC, MCM, may utilize the methods described herein. Display technologies such as LCD's, LED's, and OLED's, as used in automobiles, computers, mobile phone handsets, and televisions may also incorporate connections made by the methods described herein. Other electronic components that may similarly incorporate such technology include, but are not limited to: ASIC chips, memory devices, MCU, high frequency device modules, integrated passive components, etc.

The methods described herein can also be used to create interconnects, thermal vias or heat conductors or non-heat conductors, inductors, capacitors and resistors, to the extent that they benefit from techniques that create connections between two layers of materials. The method can further be used for optoelectronic devices such as photonic crystals, wave guides, filters, optoelectronic circuits, etc. The method can also used for biological devices, or mixed biological and silicon-based devices, such as lab-on-a-chip arrays, and probes for bio-diagnostics.

Structure

The apparatus created by the process described herein comprises a carrier with nanostructures embedded within the carrier, wherein the nanostructures were grown to have a specific morphology and functionality. The nanostructures are oriented so as to be approximately parallel to each other and perpendicular to the substrate. The nanostructures are of an approximate desired length or height.

FIGS. 1-8 illustrate, schematically, the methods and apparatus described herein. It would be understood that, although FIGS. 1-8 have been illustrated using a carbon nanofiber (CNF), other forms of nanostructures may similarly be used. Such alternative nanostructures include, but are not limited to, nanotubes, nanowires, and nanoropes. Such nanostructures may be made from carbon, doped with one or more other elements, but are not so limited. Similarly, although FIGS. 1-8 have been illustrated using an adhesive polymer, other forms of polymers may alternatively be used.

FIG. 1 illustrates the overall principle of bonding and electrical contacting of two adjacent metal layers, such as a die to a substrate, using a pad of carbon nanofibers in a matrix.

Shown in FIG. 1 are three layers: a substrate 100 having an embedded contact pad 110, on top of which is a layer of adhesive polymer 200 that surrounds a number of carbon nanofibers (CNF) 210 oriented perpendicularly to the substrate 100 and some of which are in contact with contact pad 110, and on top of the adhesive polymer layer is a device layer 300. The device layer 300 includes an I/O pad 310, to which a number of the carbon nanofibers are connected, a first metal plug 320, made from tungsten as an example, on top of the I/O pad, and a second metal plug 330, on top of the first plug. Plugs 320, 330 are different from one another, and can be made of tungsten or any other metal used in the industry such as Al, Cu, or Au.

Figure 2:
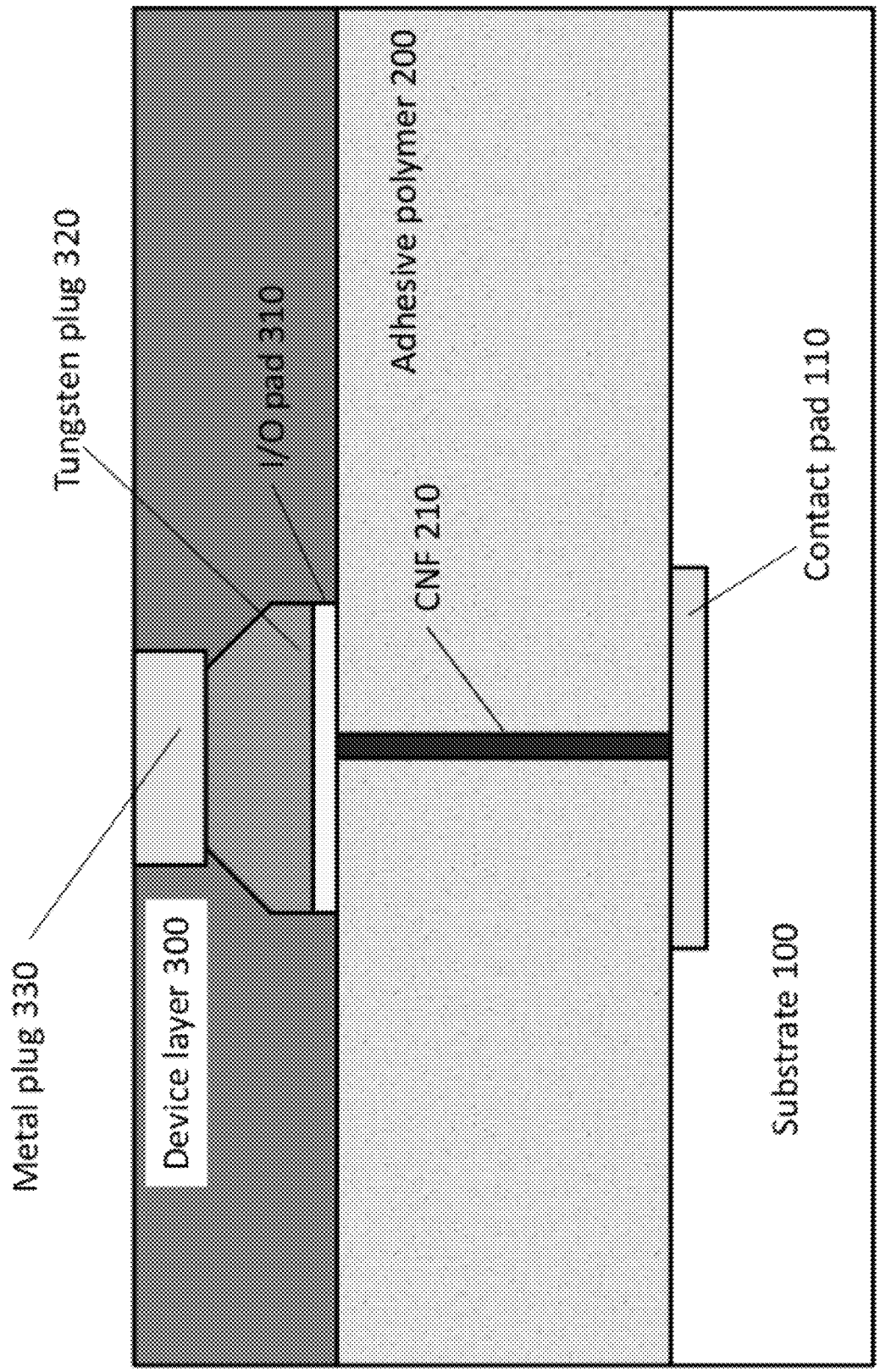
FIG. 2: bonding and electrical contacting of a die to a substrate using carbon nanofibers in a matrix, prior to curing.

FIG. 2 shows bonding and electrical contacting of a die to a substrate using carbon nanofibers in a matrix, prior to curing. Only a single CNF is shown in this figure, purely for ease of illustration.

Figure 3B:
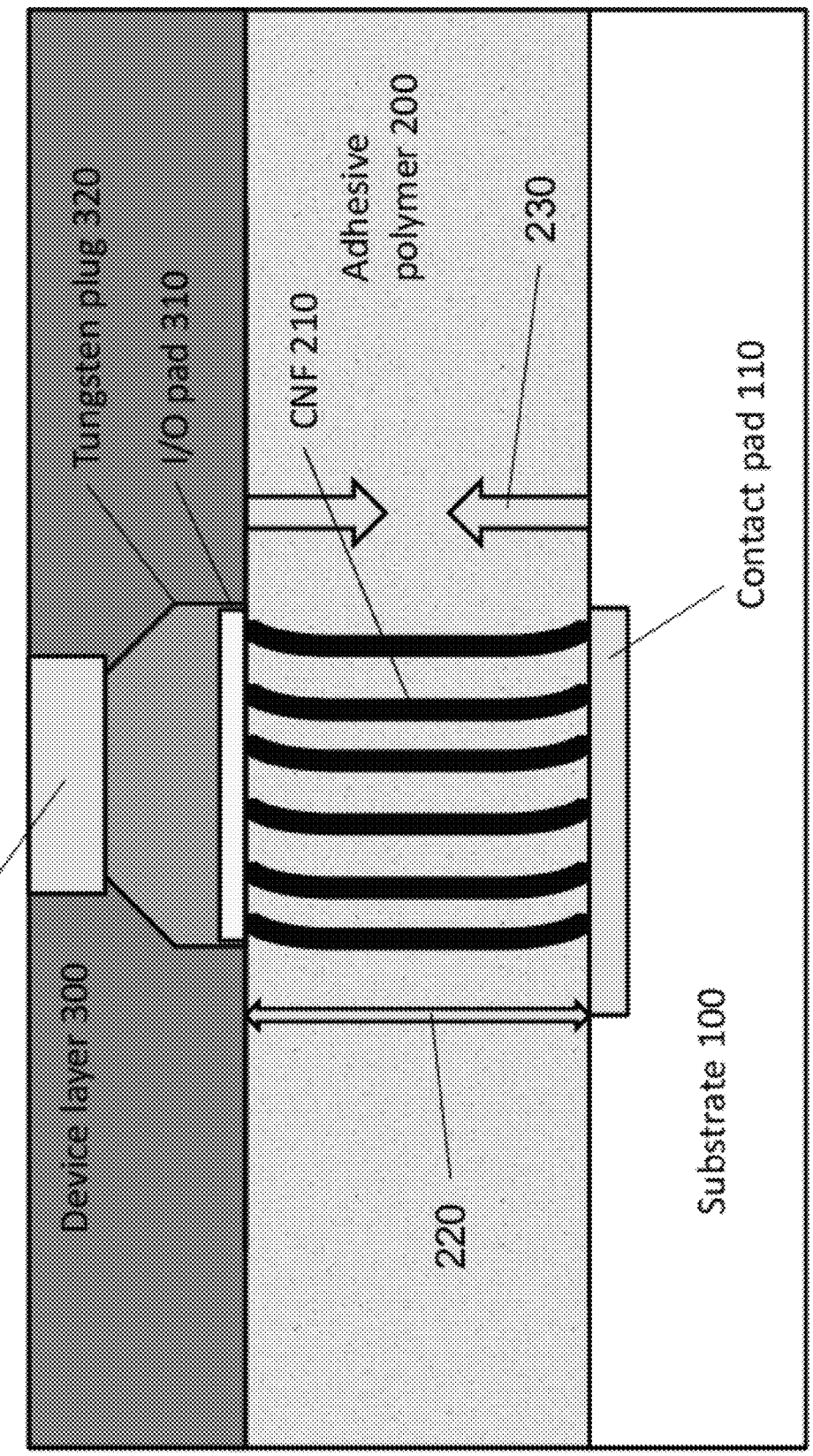

FIGS. 3A, 3B show bonding and electrical contacting of a die to a substrate using carbon nanofibers (only a single CNF is shown in FIG. 3A, for ease of depiction) in an adhesive polymer matrix, after curing. Double-headed arrow 220 indicates a straightening force inducing a "spring load" in the CNF. Two single headed arrows 230 indicate a contracting adhesive force induced by curing.

FIG. 3B shows bonding and electrical contacting of a die to a substrate using carbon nanofibers in a matrix, after curing. Double-headed arrow 220 indicates a straightening force inducing "spring load" in the CNF. Two single headed arrows 230 indicate a contracting adhesive force induced by curing.

Figure 4:
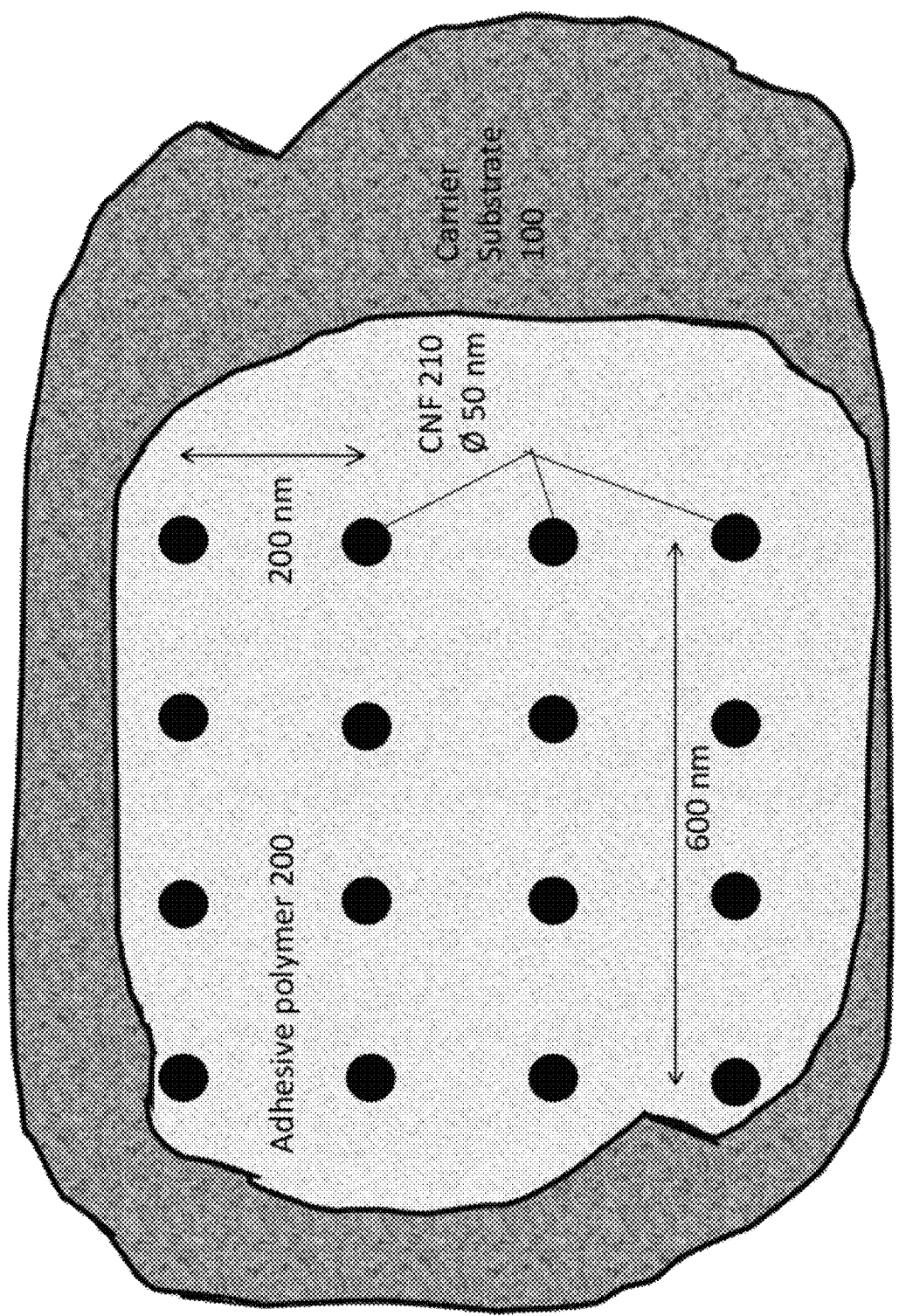
FIG. 4: Top view of carbon nanofibers in a matrix.

FIG. 4 shows a view from the top of an array of carbon nanofibers in a matrix. Representative spacings are shown. The pitch between adjacent nanostructures is 200 nm; the dimension of the array is 600 nm; and the nanofibers have a diameter of 50 nm.

Figure 5:
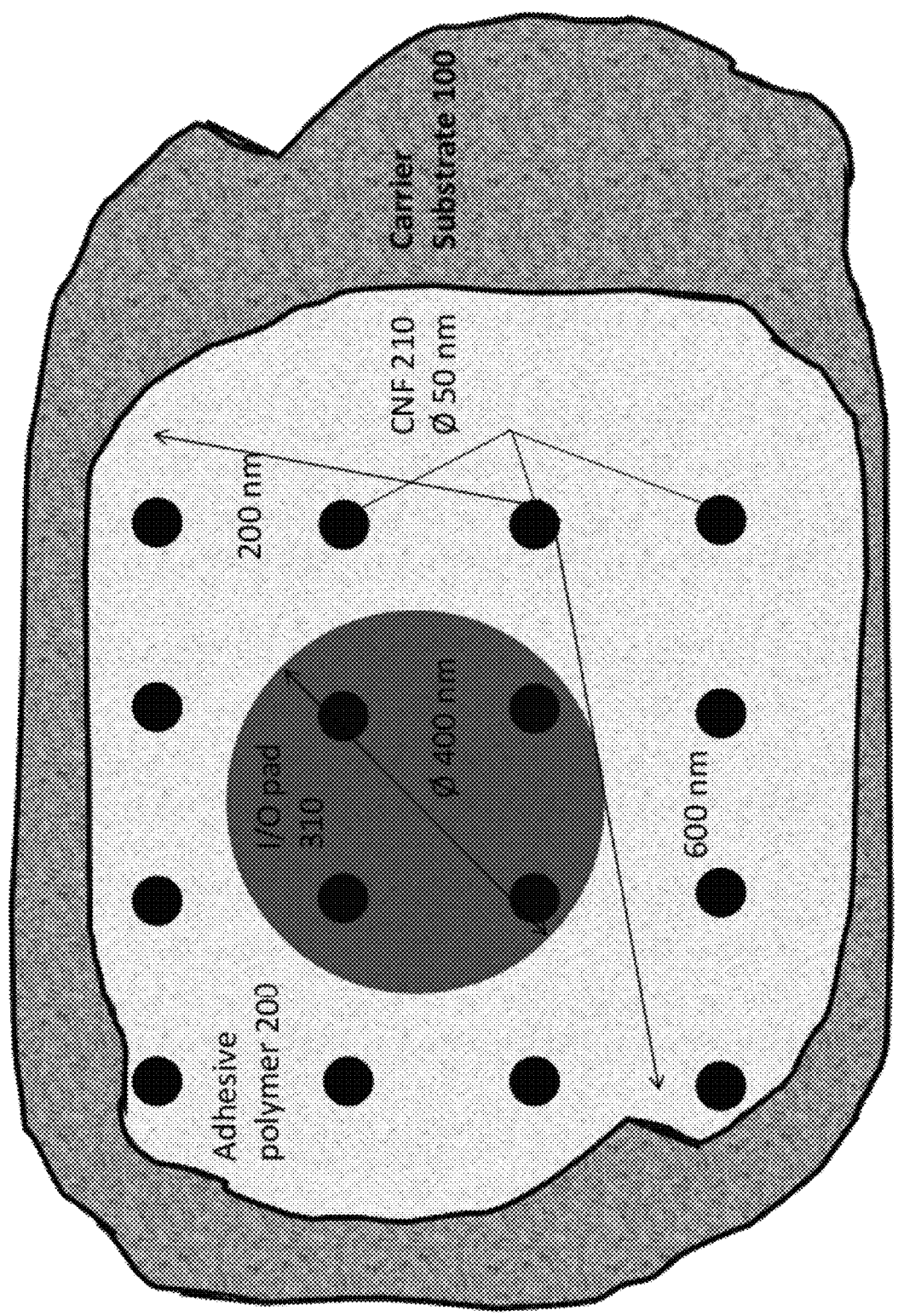
FIG. 5: Top view of carbon nanofibers in a matrix with an I/O pad.

FIG. 5 shows a view from the top of an array of carbon nanofibers in a matrix with an I/O pad overlaying a subset of the nanostructures. Representative spacings are shown. The pitch between adjacent nanostructures is 200 nm; the dimension of the array is 600 nm; and the nanofibers have a diameter of 50 nm; the diameter of the I/O pad is shown as 400 nm.

It would be understood by one skilled in the art that the spacings shown in FIGS. 4 and 5 are exemplary, and that the operation of technology herein is not dependent on the precise values of those spacings, as shown in the figures.

Figure 6:
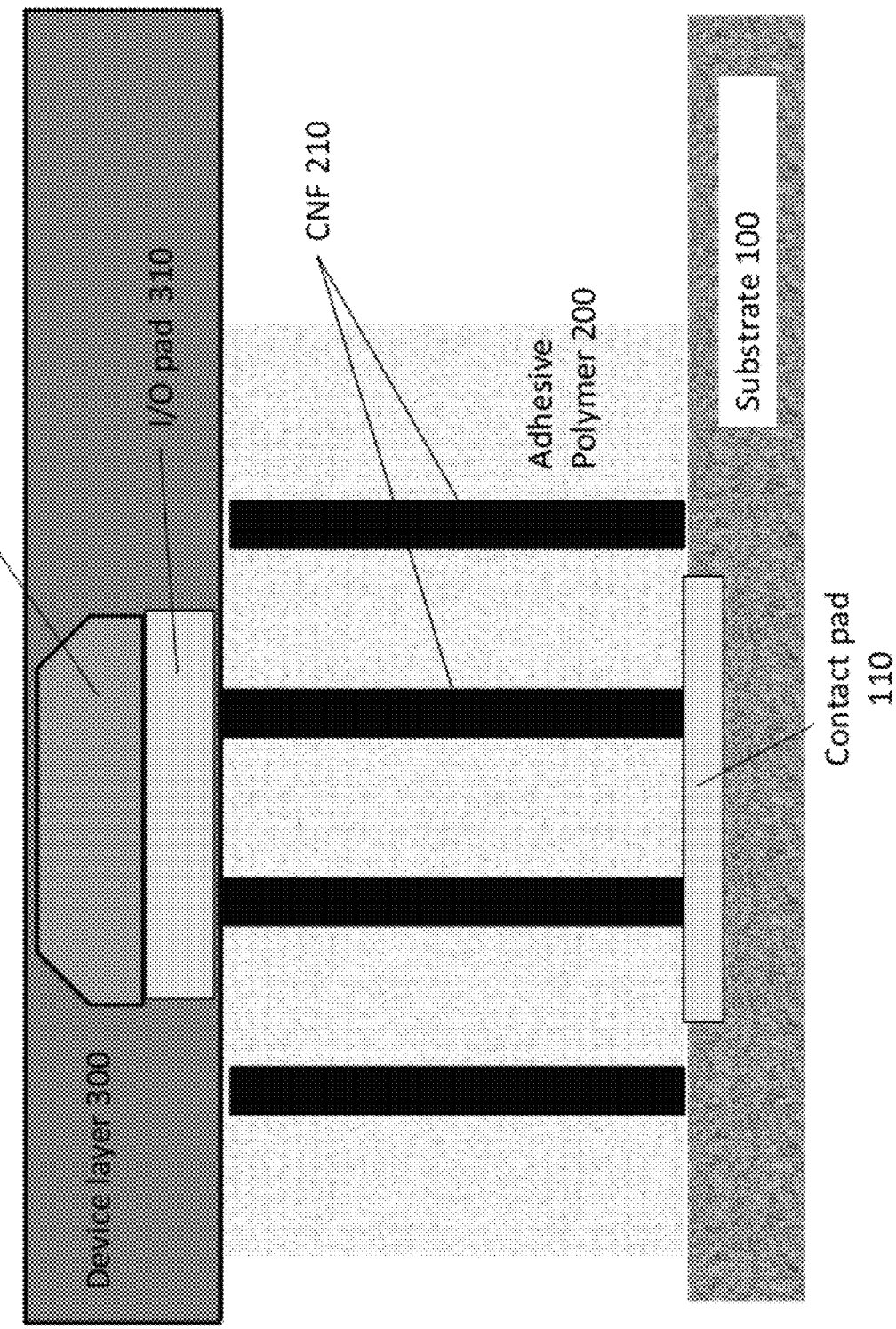
FIG. 6: Cross-sectional view of carbon nanofibers in a matrix with an I/O pad.

FIG. 6 shows a cross-sectional view of carbon nanofibers in a matrix with an I/O pad, such as that shown in FIG. 5. Certain of the nanostructures connect the contact pad and the I/O pad, whereas others are disposed outside of the area that the pads have in common and need not, as shown, extend through the entire thickness of the adhesive layer.

EXAMPLE 1

Process for Creating Contacts Using Nanostructures and an ACF

This example provides a method of connecting two surfaces/layers (such as between a contact surface/layer of a first die or chip, and a contact layer/surface of a second die or chip to which the first is going to be attached). The connection is by bonding and electrically/thermally contacting with any pitch in the range of 1 millimeter to 2 nm and typically down to 20 nm where the electrically/thermally contacting elements are based on nanostructures.

A structure consistent with this method consists of: (a) a layer of carrier (such as based on flexible, or solid material, for example polyimide), (b) nanostructures embedded in the carrier with specific morphology and functionality where they are oriented parallel with each other and perpendicular to both carrier surfaces, and (c) where the nanostructures can be grown according to methods described in international patent application PCT/SE2006/000487 (which is hereby incorporated by reference) such that control is demonstrated over morphology, dimension, length, distance, etc.

A typical nanostructure assembly for use herein comprises: a conducting substrate (such as a metal); a first catalyst layer on the conducting substrate; a nanostructure supported by the first catalyst layer; and a plurality of intermediate layers between the conducting substrate and the first catalyst layer, the plurality of intermediate layers including at least one layer that affects a morphology of the nanostructure and at least one layer to affect an electrical property of an interface between the conducting substrate and the nanostructure.

Features of the structure include: the contacting elements (nanostructures) are perpendicular to the connecting surfaces, although the nanostructures are parallel with each other. The properties of the nanostructures can be tailored according to methods of growth. Each unit can be combined with other such units for assembly into further structures, much as building blocks, like Lego, can be.

FIG. 7 illustrates steps in an exemplary process for connecting two surfaces or layers by bonding and creating electrical or thermal contacts comprising nanostructures. The steps comprise: growing a layer of carbon nanostructures on a conducting substrate with a plurality of intermediate layers between the conducting substrate and the nanostructures (701); coating the resulting nanostructures with an adhesive polymer (or some other insulating material) to form a film with embedded nanostructures (702); polishing the film to create nanostructures of a uniform desired length (703); dicing the film to create individual pads (704); lifting the pads (705); applying each pad between a first conductive surface or layer (e.g., the surface of a die) and a second conductive surface or layer (of, for example, a contact on a chip) (706); and curing the pads, such that the die is bonded to the pad and the pad is bonded to the contacting surface, thus creating electrical or thermal contacts between the die and the contacting surface by way of the nanostructures embedded within the pad (707).

The first step (701) of growing the layer of nanostructures on a conducting substrate with a plurality of intermediate layers between the conducting substrate and the nanostructures comprises growing the nanostructures, typically with a density of greater than 10 nanostructures per μm. Such a density, or the required density in a given instance, may be achieved by controlled application of catalyst dots on the substrate. Nanostructures are preferably grown using any of the various CVD-based methods, but may be grown or formed using any standard technique.

The second step (702) of spincoating the resulting nanostructures with an adhesive polymer (or other insulating material) to form a film with embedded nanostructures may be accomplished using any coating technique of forming a carrier for the nanostructures (in a film or other layer) such as spincoating or an equivalent technique, wherein the nanostructures are embedded within the carrier. Such a carrier may comprise an adhesive polymer or any other equivalent material that is able to adhere to a die and a contacting surface, by way of curing, pressure, heat, or other equivalent processes. The methods described herein are not limited to the exemplary embodiment of spincoating or the exemplary embodiment of use of an adhesive polymer that may be cured.

The third step (703) of polishing the carrier to achieve a uniform desired length for the nanostructures may be accomplished using any standard technique of polishing appropriate to the instant technology, whether mechanical, chemical, or otherwise. The determination of whether the nanostructures have attained the uniform desired length may, likewise, be made using any standard technique known or utilized within the art or related arts. This step is optional.

The fourth step (704) of dicing the carrier to create individual pads may be accomplished using any standard technique of dicing or otherwise creating individual pads of a desired shape and size.

The fifth step (705) of lifting the individual pads (portions of film comprised of vertically aligned carbon nanostructures embedded in adhesive polymer) may be accomplished using any standard technique of lifting such pads.

The sixth step (706) of applying each pad between a first conductive surface (of, for example, a die) and a second conductive surface (of, for example, a contact on a chip) may be accomplished using any standard technique of applying and positioning such a pad in such a location.

The seventh step (707) of curing the pads results in creation of a bond, wherein the pad is sandwiched between, and bonded to, both conductive surfaces. This bond creates electrical or thermal contacts between the two conductive surfaces by way of the nanostructures embedded within the pad. This step is not limited to curing an adhesive polymer; it may comprise any standard technique of causing adhesion between the nanostructures embedded within the pad and the die on one side of the pad and the contacting surface on another side of the pad.

This overall process has several advantages: eliminating the need for traditional bumps, reducing the minimum possible distance between the two conductive surfaces, decreasing both the height and width of the contact points, allowing for an increase in the number and density of the contact points, eliminating complications related to the need to control the degree of pressure applied to the ACF, and enabling finer pitches by replacing particles with nanostructures, and reducing the risk of misalignment.

Consistent with the instant example, a controllable density of nanostructures (NS) per micrometer permits an increase in the effective contact points, when compared to current solutions based on spherical particles. For example, 100 NS/micrometer square (with an NS diameter of 50 nm) gives 100 individual contacting points, (see also FIGS. 4 and 5). Given dimensions of the I/O point of 20×20 micrometer, the number of individual contacting points can be 4,000 in that region.

EXAMPLE 2

Process for Creating Spring Load Connections

A carrier (which can be based on flexible, polyimide or solid material) containing vertically aligned nanostructures (NS) (parallel oriented with each other and perpendicular to both carrier surfaces, and such as prepared by steps described in Example 1) is placed between the surface of a die and a contacting surface. See FIG. 2 and FIG. 4 as examples.

By curing of the carrier containing the vertically aligned nanostructures (using heat or chemical components or light), the carrier will contract (decreasing the distance between the die and contacting layer).

The contracting of the carrier will induce a contracting force on the vertically aligned nanostructures. The result of the contracting force on the nanostructures will be a slight bending of the nanostructures. However, due to difference in the Young modulus between the nanostructures and the surrounding materials, the nanostructures will have a tendency to straighten.

The forces described above create the "spring-load" force in the nanostructures. When the nanostructures embedded in the carrier material are placed between the two conducting surfaces, the spring-load force will secure the contacts to the ends of the nanostructures. (See FIGS. 3A and 3B as examples.)

Figure 8:
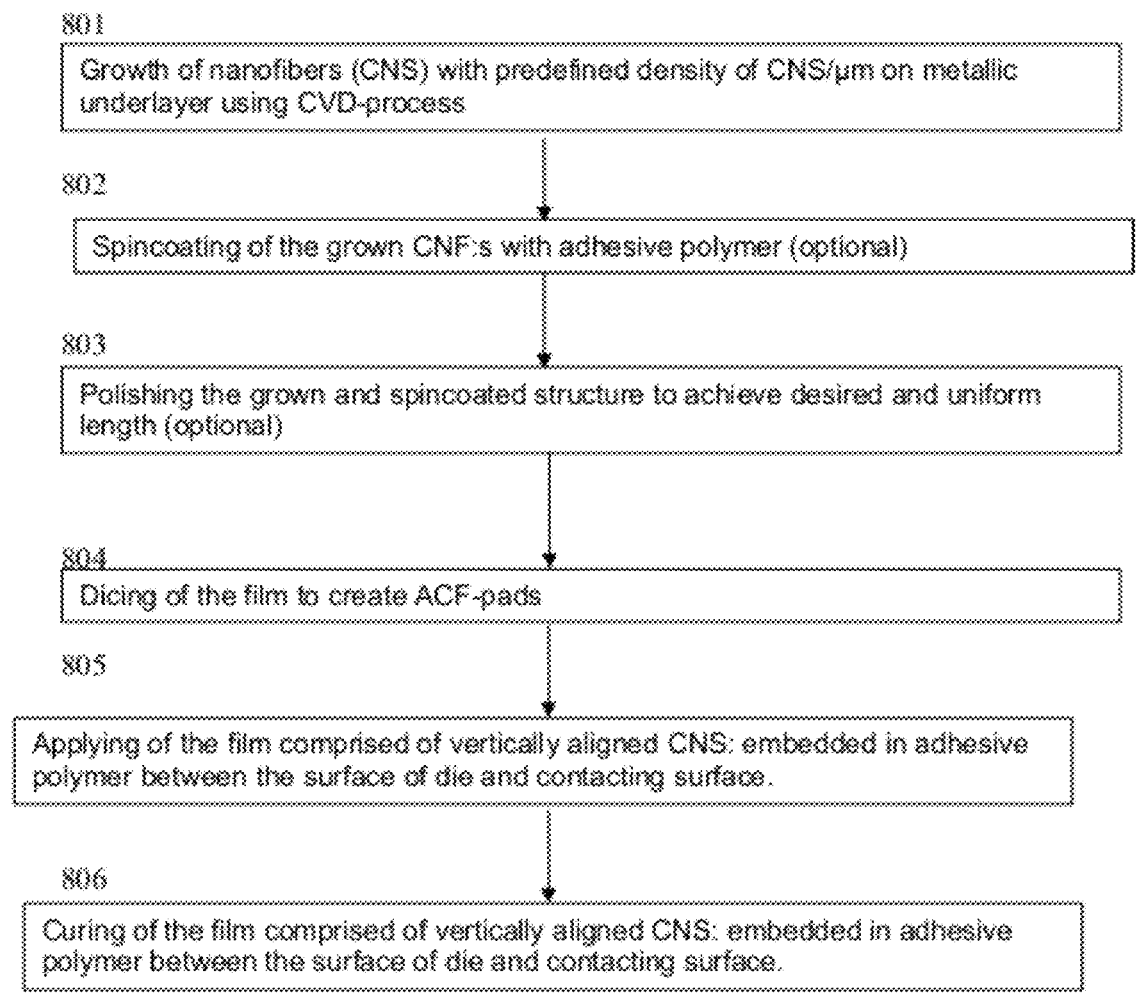
FIG. 8 shows a flow-chart of a process as described herein.

A process of providing a spring-loaded connection by providing bonding of the die to the substrate, creating and securing the electric contact by using the NS's embedded in carrier, is shown in FIG. 8. Steps of FIG. 8 that are common with those of FIG. 7 are described in connection with Example 1, herein, and are not repeated here.

During the sixth step (806) of curing the pads of carrier with embedded nanostructures, the curing process may use heat, or chemical components, or light to cause the carrier to contract, thereby decreasing the distance between the die and contacting layer.

The nanostructures of this example can be made according to the same methods as the nanostructures of Example 1, herein, and in particular can be grown according to methods described in international patent application PCT/SE2006/000487 (which is hereby incorporated by reference) such that control is demonstrated over morphology, dimension, length, distance, etc.

The process described in this example can be utilized to address the lead breakage and misalignment issues that can arise with Chip On Flex applications.

Similarly to the structures of Example 1, properties of the spring-loaded structure include: the contacting elements (nanostructures) are perpendicular to the connecting surfaces, although the nanostructures are parallel with each other. The properties of the nanostructures can be tailored according to methods of growth. Each unit can be combined with other such units for assembly into further structures.

This overall process has several advantages: reducing the minimum possible distance between the two conductive surfaces, decreasing both the height and width of the contact points, allowing for an increase in the number and density of the contact points thereby increasing the effective contact area, eliminating complications related to the need to control the degree of pressure applied to the ACF, enabling finer pitches by replacing particles with nanostructures, and reducing the risk of misalignment, and securing of the electric contact between two points placed on the opposite surfaces using nanostructures which are slightly bent. When the nanostructures are slightly bent it is possible to minimize gap creation due to surface roughness in the bonding surfaces.

Consistent with the instant example, a controllable density of nanostructures (NS) per micrometer permits an increase in the effective contact points, when compared to current solutions based on spherical particles. For example, a controllable nanostructure diameter ranging from 1 nm to 200 nm) gives a predefined individual contact point and a contact area per nanometers square.

EXAMPLE 3

Wafer Level Bumping (WLB)

This example demonstrates how wafer level bumping can be achieved by growing a matrix of nanostructures on I/O points on electronic circuits to thereby create electronic assembly for dies. The method can also be a method of connecting two surfaces/layers (contact surface/layer of the die or chip, and contact layer/surface of the die or chip to which the first layer will be connected), by bonding and electrically and/or thermally contacting with any pitch in range of 1 centimeter to 2 nm, and typically down to 1 μm, where the electrically/thermally contacting elements are based on nanostructures.

The following three cases illustrate possible embodiments.

Case 1: Vertically aligned nanostructures grown on I/O points on a integrated circuits of a wafer thereby creating a matrix structures and embedded in a curable (in UV/laser/light) material with adhesive nature, which is corresponding to the connecting points on a substrate where the die needs to be connected to.

Case 2: Vertically aligned nanostructures grown on I/O points on a integrated circuits of a wafer thereby creating a matrix structures and which is corresponding to the connection points on a substrate at which the die needs to be connected, and the attachment is made via traditional high temperature soldering process.

Case 3: Vertically aligned nanostructures grown on I/O points on an integrated circuit of a wafer creating a matrix structure, which is corresponding to the connecting points on a substrate at which the die needs to be connected.

In general, similarly to the structures of Examples 2 and 3, properties of the wafer level bumping structure include: the contacting elements (nanostructures) are perpendicular to the connecting surfaces, although the nanostructures are parallel with each other. The properties of the nanostructures can be tailored according to methods of growth. The vertically aligned nanostructures can form groups of connecting structures with a dimension from 1 millimeter down to 2 nm.

The nanostructures of this example can be made according to the same methods as the nanostructures of Examples 1 and 2, herein, and in particular can be grown according to methods described in international patent application PCT/SE2006/000487 (which is hereby incorporated by reference) such that control is demonstrated over morphology, dimension, length, distance, etc.

A process of providing a wafer-level bump is shown in FIG. 9. Steps of FIG. 9 that are common with those of FIGS. 7 and 8 are described in connection with Examples 1 and 2, herein, and are those descriptions are not repeated here.

In current systems, bumps for can have a diameter from 500 micrometer and downwards. The method of this example permits a groups of nanostructures to be assembled, each individual group having the same dimension as today's bumps. However, the present technique also permits smaller bumps, even down to bumps that comprise a single nanostructure.

Composite bumps can also be formed by methods based on those described herein. Standard evaporation, electroplating and/or electroless plating can be carried out after the growth of nanostructures to form composites bumps where necessary. Different metals/metallic materials from periodic table such as Ti, Cr, TiW, Cu, Au or any other suitable metal can be evaporated, electroplated, and/or electroless plated after the growth of nanostructures. Standard immersion gold process can also be carried out to coat gold where necessary. Electroless plating process may consists of conditioning, acid etching, plating through different chemical compositions for different metal for example, Ni, Cu, Zn, Sn, or different alloys.

What is claimed:

1. A bonding film, for interconnecting a first conductive surface with a second conductive surface through said bonding film,
    wherein said bonding film comprises a plurality of nanostructures embedded in a polymeric carrier,
    said nanostructures being oriented in parallel with each other and extending perpendicularly to top and bottom surfaces of said polymeric carrier,
    wherein said polymeric carrier is configured to:
    adhere to said first conductive surface and said second conductive surface when arranged therebetween; and
    contract when cured, so as to provide a spring-load force in said nanostructures, whereby a reliable contact between said nanostructures and each of said first conductive surface and said second conductive surface can be achieved.

2. The bonding film according to claim 1, wherein said nanostructures are electrically or thermally conductive.

3. The bonding film according to claim 2, wherein each of said nanostructures comprises two or more interdiffused materials, the two or more interdiffused materials including at least one material that affects a morphology of said plurality of nanostructures and at least one material that affects an electrical property of said plurality of nanostructures.

4. The bonding film according to claim 3, wherein at least one material of the two or more interdiffused materials is present at least one of a tip and a base of each of said nanostructures.

5. The bonding film according to claim 3, wherein at least one material of the two or more interdiffused materials is selected from the group consisting of amorphous silicon and germanium.

6. A method of interconnecting an electronic component having a conductive component surface, and a substrate having a conductive substrate surface, said method comprising the steps of:
    arranging the bonding film according to claim 1 between said conductive component surface and said conductive substrate surface; and
    curing the carrier comprised in said bonding film, so as to provide a spring-load force in the nanostructures comprised in said bonding film, thereby achieving a reliable contact between said nanostructures and each of said conductive component surface and said conductive substrate surface.

* * * * *

UNITED STATES PATENT AND TRADEMARK OFFICE
CERTIFICATE OF CORRECTION

PATENT NO.        : 8,253,253 B2
APPLICATION NO.   : 13/361436
DATED             : August 28, 2012
INVENTOR(S)       : Brud et al.

It is certified that error appears in the above-identified patent and that said Letters Patent is hereby corrected as shown below:

Column 1, line 12, after "herein" please insert -- in --; and

Column 14, line 35, Claim 4, please delete "at" and insert therefor -- at at --.

Signed and Sealed this
Sixteenth Day of October, 2012

David J. Kappos
*Director of the United States Patent and Trademark Office*